United States Patent [19]

Taya et al.

[11] Patent Number: 4,476,393
[45] Date of Patent: Oct. 9, 1984

[54] ION IMPLANTATION APPARATUS

[75] Inventors: Shunroku Taya, Mito; Mituo Fujiwara, Katsuta, both of Japan

[73] Assignee: Hitachi, Ltd., Tokyo, Japan

[21] Appl. No.: 374,873

[22] Filed: May 4, 1982

[30] Foreign Application Priority Data

May 7, 1981 [JP] Japan ................................. 56-68779

[51] Int. Cl.³ ............................................ H01J 37/00
[52] U.S. Cl. ................................ 250/492.2; 250/398
[58] Field of Search ..................... 250/492.2, 398, 442, 250/443; 313/361

[56] References Cited

U.S. PATENT DOCUMENTS 3,778,626 12/1973 Robertson ..................... 250/492.2
4,017,403 4/1977 Freeman ......................... 250/492.2
4,367,411 1/1983 Hanley et al. ................ 250/396 MC
4,383,178 5/1983 Shibata et al. ................... 250/492.2

Primary Examiner—Bruce C. Anderson
Attorney, Agent, or Firm—Antonelli, Terry & Wands

[57] ABSTRACT

An ion implantation apparatus in which ions are dispersed by a dispersion magnetic field and the dispersed ions of a predetermined mass number are focused on a slit and directed therethrough toward a target. The ions of the predetermined mass number are electromagnetically scanned by a deflection magnetic field preceding the slit in a direction which is orthogonal to the dispersion plane. The target is subjected to reciprocating motion in a direction which is orthogonal to the scanning direction of the ions of the predetermined mass number.

13 Claims, 6 Drawing Figures

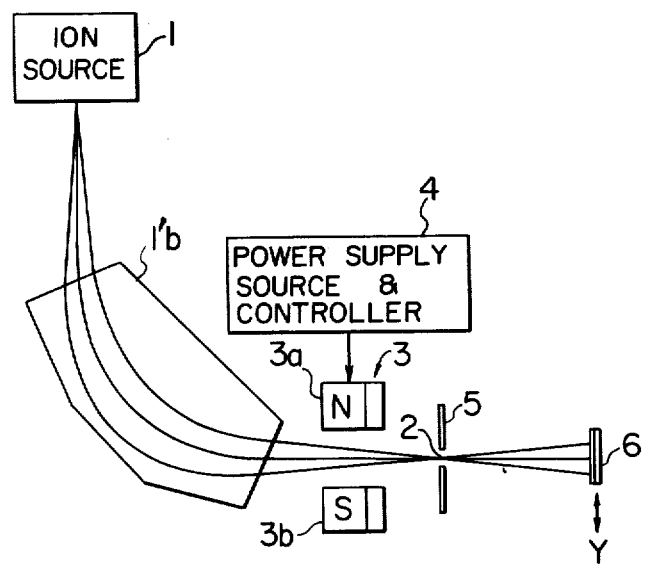
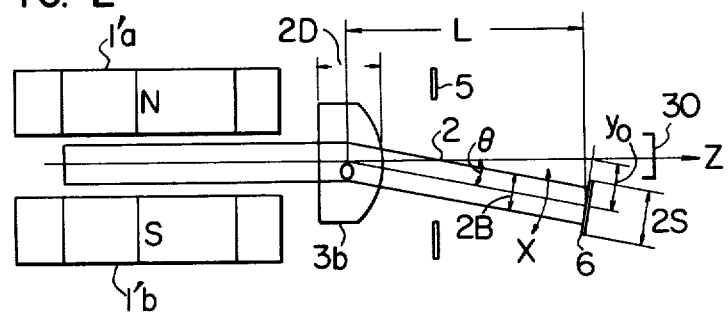
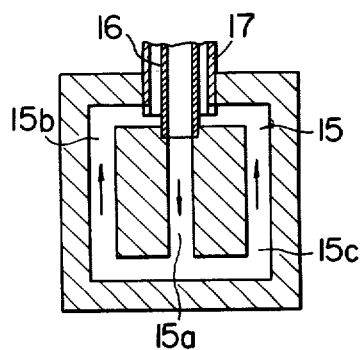
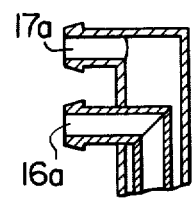
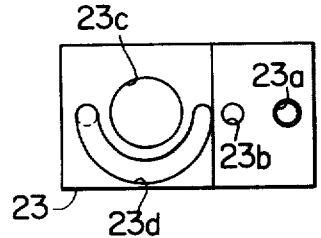

ION IMPLANTATION APPARATUS

BACKGROUND OF THE INVENTION

1. Field of the Invention

This invention relates to an ion implantation apparatus and more particularly to an ion implantation apparatus suitable for use in the production of semiconductors or semiconductor material.

2. Description of the Prior Art

In the ion implantation apparatus used for the production of semiconductors, ions of a predetermined mass number dispersed by a magnetic field are focused on a slit and passed through the slit to be directed toward a target.

The target is rotated about an axis which is parallel to a passage through which the ions travel, with the rotation radius being equal to a distance between the passage and the axis. The target is also moved in the radial direction at a speed which is inversely proportional to the radius in order to make uniform the ion implantation on the target.

In general, a control mechanism for the movement of the target at a speed inversely proportion to the radius is undesirably complicated. Therefore, a substitutive expedient for the radial movement of the target has been proposed wherein the ions are electrostatically scanned in the radial direction.

In the electrostatic scanning type arrangement, electrons coexisting with the ions are attracted by electrostatic force, with the result that mutual repulsion of ions scatters ions in all the directions, raising a different problem that efficiency of the ion implantation on the target is lowered. This problem is aggravated in the case of implantation of a large ion current.

SUMMARY OF THE INVENTION

Accordingly, an object of this invention is to provide an ion implantation apparatus capable of preventing scattering of ions.

Another object of this invention is to provide an ion implantation apparatus capable of relatively reducing the angle of ion implantation.

In an ion implantation apparatus according to this invention, ions are dispersed in accordance with the difference in their mass numbers on a predetermined plane, and the dispersed ions of a predetermined mass number are focused on a predetermined position. The dispersed ions of the predetermined mass number are electromagnetically scanned at a position preceding the predetermined position in a first direction which is substantially orthogonal to the dispersion plane. The dispersed and scanned ions of the predetermined mass number are passed through a slit in a slit member disposed at the predetermined position and directed toward a target. The target is moved in a second direction which is substantially orthogonal to the first direction.

BRIEF DESCRIPTION OF THE DRAWINGS

FIG. 1 is a diagrammatic view of an ion optical system of an ion implantation apparatus showing an embodiment of the invention.

FIG. 2 is a bottom view of FIG. 1.

FIG. 4 is a sectional view taken along line IV—IV' in FIG. 3.

FIG. 5 is a sectional view taken along a line V—V' in FIG. 3.

FIG. 6 is a plan view of a mover in FIG. 3.

DESCRIPTION OF PREFERRED EMBODIMENTS

Figure 3:
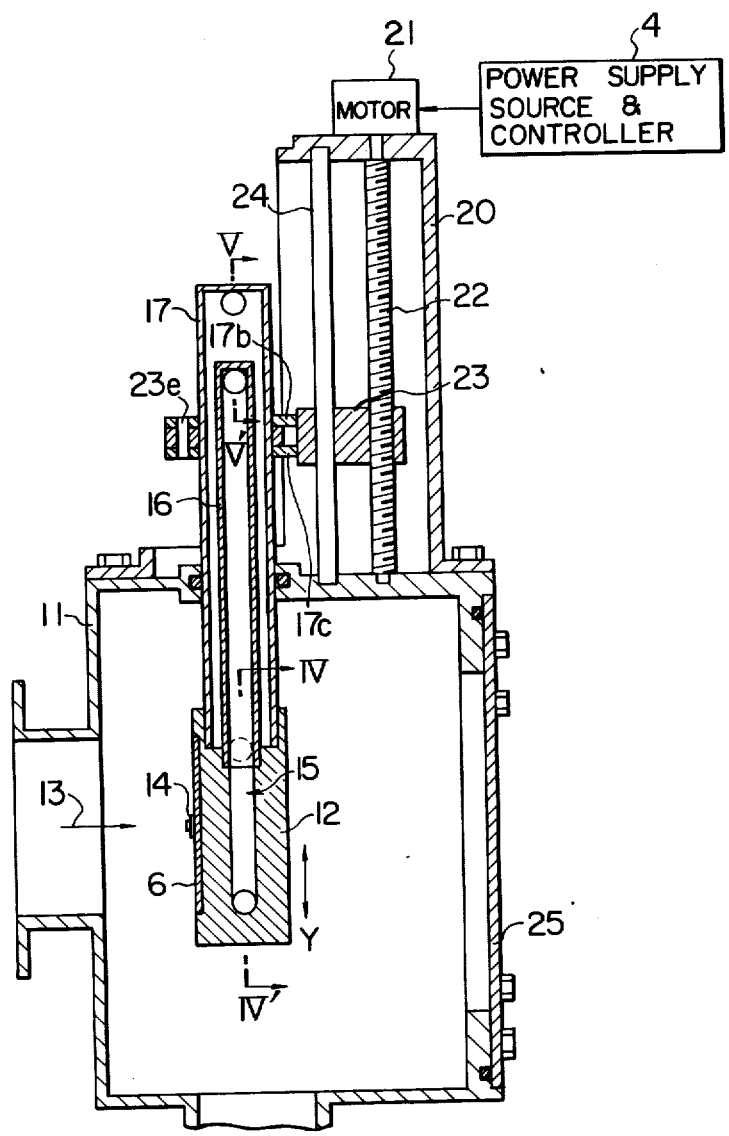
FIG. 3 is a longitudinal sectional view showing a target moving mechanism of the ion implantation apparatus incorporating the invention.

Referring now to FIGS. 1 and 2, ions generated from an ion source 1 come into a dispersion magnetic field formed by a pair of magnetic poles $1a'$ and $1b'$ therebetween. The dispersion magnetic field disperses the ions in accordance with the difference to their mass numbers, and the dispersed ions of a predetermined mass number are focused on a predetermined position 2. Disposed between the dispersion magnetic field formed by the magnetic poles $1a'$ and $1b'$ therebetween and the position 2 is a deflector 3. The deflector 3 is of an electromagnetic type having a pair of magnetic poles $3a$ and $3b$. A deflection magnetic field formed between the magnetic poles $3a$ and $3b$ is so controlled by a power supply source and controller 4 that the dispersed ions of the predetermined mass number are deflected by a predetermined angle of $\theta$ with respect to an axis through which the ions would travel in the absence of the deflector 3, that is, a Z axis, and is scanned repeatedly about a central axis at the deflected angle.

Disposed at the position 2 is a slit member 5 which is formed with an elongated slit having a width suitable for passing the ions of the predetermined mass number focused on the position 2 and a height sufficient for passing the scanning ions of the predetermined mass number. Accordingly, ions other than ions of the predetermined mass number focused on the position 2, are interrupted by the slit member 5, and only the scanned ions of the predetermined mass number are passed through the slit in the slit member 5 and projected on a target 6.

The target 6, on the other hand, is reciprocated at a constant or uniform speed in a direction which is orthogonal to the X direction, that is, in a Y direction. Consequently, only the ions of the predetermined mass number are implanted over the entire area of the target 6. Preferably, the scanning speed of the ions in the X direction is made higher than the speed of reciprocating motion of the target 6 in the Y direction for the sake of improving uniformity of the ion implantation. Practically, for example, the target 6 may be reciprocated in the Y direction at a rate of one reciprocation per minute and the ion beam may be scanned in the X direction at a frequency of 1 Hz.

To discuss the intensity of the deflection magnetic field formed between the magnetic poles $3a$ and $3b$, it is assumed that the width of an effective deflection magnetic field formed by the magnetic poles $3a$ and $3b$ is 2D, the distance along the Z axis between a center 0 of the deflection magnetic field and the target 6 is L, the distance along the surface of the target 6 between the Z axis and the center of the target is Yo, the width in the X direction of the target 6 is 2S, and the width in the Y direction of the ions is 2B. Then, the intensity, H min, of a minimum deflection magnetic field corresponding to a minimum deflection distance $y\ min = yo - S - B$ of the ions on the target 6, and the intensity, H max, of a maximum deflection magnetic field corresponding to a maximum deflection distance $y\ max = yo + S + B$ are given by:

$$H_{min} = 72\sqrt{MV}(yo - S - B)/DL$$

$$H_{max} = 72\sqrt{MV}(yo + S + B)/DL$$

where V represents ion acceleration voltage and M ion mass number.

Practically, for example, for M/e=80 (e: ion electric charge). U=80,000 V, D=8 cm, L=75 cm, yo=15 cm, S=5 cm and B=2 cm, H min is 2,430 gauss and H max is 6,680 gauss. The deflection magnetic field of this order may readily be materialized by a relatively small-sized electromagnetic type deflector.

With reference to FIG. 3, there is shown a vacuum target chamber 11 in which a target support 12 is arranged. The target support 12 carries the target 6, on which the ions entering in a direction of arrow 13 is implanted, by means of a leaf spring 14 removably mounted to the support 12 by a screw. The target support 12 has a channel 15 through which a coolant such as water for cooling the target 6 is circulated. As shown in FIG. 4, the channel 15 comprises a central conduit 15a and side conduits 15b and 15c in communication therewith. Fixed to the upper end of the target support 12 are an inner pipe 16 in communication with the central conduit 15a and an outer pipe 17 arranged externally of the inner pipe and in communication with the side conduits 15b and 15c. The inner and outer pipes 16 and 17 extend through the target chamber 11 by way of an O ring for vacuum sealing, and their extensions terminate in a coolant inlet 16a and a coolant outlet 17a, respectively, as shown in FIG. 5. The coolant inlet 16a is connected to a supply source of water as the coolant not shown. Thus, water from the supply source is passed through the coolant inlet 16a, inner pipe 16, central conduit 15a, side conduits 15b and 15c and outer pipe 17 and discharged from the coolant outlet 17a. As a result, the target 6 is cooled by heat conduction through the medium of the target support 12 to prevent excessive temperature rise due to the ion implantation on the target 6.

A motor 21 is mounted on a motor mount frame 20 secured to the target chamber 11. Directly connected to the motor is one end of a feed screw 22 the other end of which is rotatably supported by the target chamber 11. A mover 23 as shown in FIG. 6 is mesh with the feed screw 22. In FIG. 6, a female screw in mesh with the feed screw 22 is designated by 23a.

A guide shaft 24 passing through a hole 23b formed in the mover 23 is fixedly supported between the motor mount frame 20 and the target chamber 11.

The mover 23 has an additional hole 23c through which the outer pipe 17 passes. The outer pipe 17 has a pair of mover clamping flanges 17b and 17c, and the mover 23 is sandwiched by these flanges.

With the above construction, when the motor 21 is rotated at a constant speed to rotate the feed screw 22, the mover 23 which is in mesh with the feed screw 22 but prevented from rotation by the guide shaft 24 moves along the guide shaft 24 at a uniform speed in the Y direction, followed by the movement of the target 6 in the same direction. Forward or reverse rotation of the motor 21, accordingly, the uniform reciprocating motion of the target 6 is controlled by the power supply source and controller 4 for the motor 21. The power supply soruce and controller 4 also permits the reciprocation frequency and the speed of target 6 to be set to desired values.

While a semicircular slit 23d which is concentric with the hole 23c is also formed in the mover 23, a pin 23e movably mating with the semicircular slit is fixed to the paired mover clamping flanges 17b and 17c. A target exchanging lid 25 is removably mounted to part of the target chamber 11 by way of an O ring for vacuum sealing.

Accordingly, when the lid 25 is removed, the target support 12 can be rotated through 180° about an axis of the outer pipe 17 which is parallel to the Y axis to make the target 6 face an opening for exchange, and the target 6 can be exchanged with another target.

As described above, the ions are scanned electromagnetically in the X direction. Electrons coexisting with the ions will therefore be subjected to a spiral motion under the influence of the magnetic field. In process of the spiral motion of electrons, these electrons collide with the residual gas to produce secondary electrons. For these reasons, such scattering of the ions as would be caused under the electrostatic scanning can be prevented.

As an alternative, the deflector 3 may conceivably be arranged between the slit member 5 and the target 6. However, the scanning width of the ions on the target 6 is widened so that the incident angle of the ions to the target 6, that is, the ion implantation angle is increased. This disadvantageously requires an additional deflector for such an angle correction as to reduce the ion implantation angle. Moreover, the additional deflector prolongs the ion passage, degrading efficiency of the ion implantation.

In contrast, since in the embodiment of the invention the deflector 3 is arranged in advance of the slit member 5, the ion implantation angle can relatively be reduced even when the ion scanning width on the target 6 is large, thereby dispersing with the additional deflector for the ion implantation angle correction and eliminating the requirement for the ion passage to be prolonged.

As has been described hereinbefore, the ions are scanned in the X direction about the central axis at the angular position deviated by $\theta$ from the Z axis. This ensures that an ion current detector 30 can be arranged on the Z axis and the ion current implanted on the target 6 can be checked as desired.

While the invention has been particularly shown and described with reference to the preferred embodiment thereof, it will be understood by those skilled in the art that various changes in form and details may be made therein without departing from the spirit and scope of the invention.

What is claimed is:
1. An ion implantation apparatus comprising:
   means for generating ions;
   dispersing and focusing means for dispersing the ions in accordance with a difference in their mass number on a predetermined plane and focusing the dispersed ions of a predetermined mass number on a predetermined position;
   means disposed between said dispersing and focusing means and said predetermined position, for electromagnetically and repeatedly scanning the dispersed ions of the predetermined mass number in a first direction which is substantially orthogonal to said predetermined plane;
   a slit member disposed at said predetermined position, for selectively directing the dispersed and scanned ions of said predetermined mass number toward a target; and means for providing reciprocating motion of the target in a second direction which is substantially orthogonal to the first direction.

2. An ion implantation apparatus comprising:
means for generating ions;
dispersing and focusing means for dispersing the ions in accordance with the difference in their mass numbers on a predetermined plane and focusing the dispersed ions of a predetermined mass number on a predetermined position;
means disposed between said dispersing and focusing means and said predetermined position, for electromagnetically and repeatedly scanning the dispersed ions of the predetermined mass number in a first direction which is substantially orthogonal to said predetermined plane;
a slit member disposed at said predetermined position, for selectively directing the dispersed and scanned ions of said predetermined mass number toward a target; and
means for providing reciprocating motion of the target at a uniform speed in a second direction which is substantially orthogonal to the first direction.

3. An ion implantation apparatus comprising:
means for generating ions;
dispersing and focusing means for dispersing the ions in accordance with the difference in their mass numbers on a predetermined plane and focusing the dispersed ions of a predetermined mass number on a predetermined position;
means disposed, between said dispersing and focusing means and said predetermined position, for electromagnetically deflecting the dispersed ions of the predetermined mass number by a predetermined angle in a first direction perpendicular to the predetermined plane and electromagnetically and repeatedly scanning said dispersed ions of the predetermined mass number about a reference axis at the predetermined angle in the first direction;
a slit member disposed at said predetermined position, for selectively directing the dispersed and scanned ions of said predetermined mass number toward a target; and
means for providing reciprocating motion of the target at a uniform speed in a second direction which is substantially orthogonal to the first direction.

4. An ion implantation apparatus according to claim 3, wherein the repetitive scanning speed of said dispersed ions of the predetermined mass number is higher than the reciprocating motion speed of said target.

5. An ion implantation apparatus according to claim 4 further comprising means for supporting said target, said supporting means having a channel through which a coolant for cooling said target is passed.

6. An ion implantation apparatus according to claim 5, wherein said target supporting means is rotatable about a predetermined axis which is substantially parallel to said second direction.

7. An ion implantation apparatus according to claim 5, wherein said target reciprocating means comprises a feed screw, a motor for rotating the feed screw, and a female screw in mesh with the feed screw, said female screw being coupled with said target supporting means so that said target supporting means can rotate relative to said female screw and about a predetermined axis which is substantially parallel to said second direction.

8. An ion implantation apparatus comprising:
means for generating ions;
dispersing and focusing means for dispersing the ions in accordance with a difference in their mass number on a predetermined plane and focusing the dispersed ions of a predetermined mass number on a predetermined position;
means disposed between said dispersing and focusing means and said predetermined position, for electromagnetically and repeatedly scanning the dispersed ions of the predetermined mass number in a first direction which is substantially orthogonal to said predetermined plane;
a slit member disposed at said predetermined position, for selectively directing the dispersed and scanned ions of said predetermined mass number toward a target; and
means for providing reciprocating motion of the target only in a second direction which is substantially orthogonal to the first direction during operation of said scanning means so that said target moves only in said second direction with no components of movement in said first direction while said scanning means scans said dispersed ions in said first direction.

9. An ion implantation apparatus according to claim 8, wherein said means for providing reciprocating motion to the target provides the reciprocating motion at a uniform speed.

10. An ion implantation apparatus according to claim 8, wherein the repetitive scanning speed of said dispersed ions of the predetermined mass number is higher than the reciprocating motion speed of said target.

11. An ion implantation apparatus according to claim 9, wherein the repetitive scanning speed of said dispersed ions of the predetermined mass number is higher than the reciprocating motion speed of said target.

12. An ion implantation apparatus according to claim 8, further comprising means for supporting said target, said supporting means having a channel through which a coolant for cooling said target is passed.

13. An ion implantation apparatus according to claim 9, further comprising means for supporting said target, said supporting means having a channel through which a coolant for cooling said target is passed.

* * * * *